US007133296B2

(12) United States Patent
Choi et al.

(10) Patent No.: US 7,133,296 B2
(45) Date of Patent: Nov. 7, 2006

(54) PORTABLE USB STORAGE DEVICE

(75) Inventors: Dae Seon Choi, Daejeon (KR); Hee Sun Kim, Daejeon (KR); Taesung Kim, Daejeon (KR); Jong-Hyuk Roh, Incheon (KR); Sang Rae Cho, Daejeon (KR); Young Seob Cho, Daejeon (KR); Seung Hun Jin, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 224 days.

(21) Appl. No.: 10/700,541

(22) Filed: Nov. 5, 2003

(65) Prior Publication Data

US 2004/0090751 A1 May 13, 2004

(30) Foreign Application Priority Data

Nov. 8, 2002 (KR) ...................... 10-2002-0069035

(51) Int. Cl.
*H05K 7/14* (2006.01)
*H05K 7/18* (2006.01)

(52) U.S. Cl. ...................... 361/798; 361/801; 361/732; 361/796; 439/377

(58) Field of Classification Search ................ 361/796, 361/798, 801, 732, 725–727, 740–741, 754–759, 361/730–731; 439/377
See application file for complete search history.

(56) References Cited

U.S. PATENT DOCUMENTS

| | | | | |
|---|---|---|---|---|
| 5,155,663 | A * | 10/1992 | Harase | 361/684 |
| 5,338,210 | A * | 8/1994 | Beckham et al. | 439/131 |
| 5,816,832 | A * | 10/1998 | Aldous et al. | 439/131 |
| 6,186,803 | B1 * | 2/2001 | Garside | 439/131 |
| 6,278,069 | B1 * | 8/2001 | Lee et al. | 200/16 C |
| 6,375,479 | B1 * | 4/2002 | Johnson et al. | 439/131 |
| 6,439,900 | B1 * | 8/2002 | Sward | 439/131 |
| 6,542,358 | B1 * | 4/2003 | Kunz et al. | 361/686 |
| 6,567,273 | B1 * | 5/2003 | Liu et al. | 361/737 |
| 6,676,419 | B1 * | 1/2004 | Lin et al. | 439/76.1 |
| 6,792,487 | B1 * | 9/2004 | Kao | 710/74 |

FOREIGN PATENT DOCUMENTS

| | | |
|---|---|---|
| KR | 2002-48850 | 6/2002 |

* cited by examiner

*Primary Examiner*—K. Cuneo
*Assistant Examiner*—Hung S. Bui
(74) *Attorney, Agent, or Firm*—Mayer, Brown, Rowe & Maw LLP

(57) ABSTRACT

A portable USB storage device includes a case, a USB port, and a control device. The case contains therein a data storage. The USB port can be inputted into the case in a sliding motion. The control device selectively controls a location of the USB port to keep the USB port.

6 Claims, 2 Drawing Sheets

PORTABLE USB STORAGE DEVICE

FIELD OF THE INVENTION

The present invention relates to a portable universal serial bus (USB) storage device; and, more particularly, to a portable USB storage device capable of enhancing usability, portability, and convenience for a user by keeping a USB port inside of a case so that the portable USB storage device can be carried and used without a sheath for protecting the USB port.

BACKGROUND OF INVENTION

Recently, various portable storage mediums have been introduced as a result of a constant change in a network environment and a demand for a more convenient data storage and improved mobility. Further, new storage mediums lead to the development of high capacity portable storage devices using a flash memory.

Such portable storage devices that have been purchased by certain experts are now used as essential peripheral devices of a personal computer (PC), e.g., a bundled product provided with a purchase of a PC, or those of a personal digital assistant (PDA), e.g., accessories of a PDA.

Accordingly, a market size of the portable storage devices will be gradually expanded. The portable storage devices have been used mainly by professionals, e.g., graphic designers who often transmit high capacity data. However, as data capacity of a multimedia file such as game software and MP3 files becomes large, purchases by non-professionals are on the rise.

Especially, since Intel Corp. and Microsoft Corp. announced their plans not to support a floppy disc drive (FDD), a portable storage device is expected to replace the FDD. Further, the portable storage device is suitable for an auxiliary storage device of a PDA having a small storage capacity. Therefore, an increasing demand for the portable storage device of PDA manufacturers is also predicted.

Major features of the portable storage device are its remarkable portability, mobility, compactness, and lightness. Moreover, the portable storage device can be simply connected without a separate adapter and does not require a separate power supply due to enough power provided from a USB port.

Meanwhile, the portable storage device having the above-described advantages has been developed based on an USB. technology. The USB is a peripheral bus protocol developed by Compaq Corp., Intel Corp., Microsoft Corp., and the like for the initial purpose of providing a simple method for integrating a computer and a telephone.

Such protocol has been developed into a USB 1.0 standard for facilitating a convenient integration of maximum 127 peripheral devices in a PC. And also, a USB 1.1 standard complements problems of the USB 1.0 standard. Such USB technology is able to support new devices capable of transmitting voice data and compressed video data in real-time, synchronizing mixed modes, varying PC components, and improving PC performance.

In the meantime, the USB, which is basically a serial bus, implements a notion of master/slave and provides a direct connection or a connection through a hub between a host and each peripheral device.

Currently, various products employing a USB interface are introduced, wherein the USB interface allows a connection between a PC and most of peripheral devices, e.g., a printer, a scanner, a keyboard, a mouse, a joystick, a gamepad, a video camera, a still image camera, a modem, an ISDN adaptor, and an ethernet adaptor.

Further, connectors, e.g., USB to IDE, USB to PS/2, USB to printer port, USB to serial port, and the like, can be used for connecting conventionally used devices with a USB port.

FIG. 1 shows a conventional portable storage device having a USB port at one side thereof.

As illustrated in FIG. 1, the conventional portable storage device has a structure of an inner main body being completely covered by a case 1. The inner main body includes therein memories (ROM and RAM), a clock signal generator, an interrupt controller (not shown), and the like, thereby enabling data to be downloaded from peripheral devices through a USB port 3 and data stored in the memories to be uploaded to a PC, PDA and the like.

Meanwhile, the portable storage device is provided with a sheath 2 for protecting the USB port 3 functioning as a main input/output unit of memories from external damages and a user from the USB port 3 made of sharp materials. Since, however, the sheath 2 is separable from the case 1, it is inconvenient to carry. Further, in case the sheath 2 is lost, it is hardly possible to protect the USB port 3. In addition, with a possibility of causing physical injuries to the user, the portable storage device is not convenient to use and carry with the sheath 2 off.

SUMMARY OF THE INVENTION

It is, therefore, an object of the present invention to provide a portable USB storage device capable of enhancing usability, portability and convenience for a user by keeping a USB port inside of a case so that the portable USB storage device can be carried and used without a sheath for protecting the USB port.

In accordance with the present invention, there is provided a portable USB storage device including: a case containing therein a data storage; a USB port capable of being inserted into the case in a sliding motion; and a control device for selectively controlling a location of the USB port.

The above and other objects and features of the present invention will become more apparent from the following description of preferred embodiments given in conjunction with the accompanying drawings by those skilled in the art.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Hereinafter, a preferred embodiment of the present invention is described in detail with reference to the accompanying drawings.

Figure 1:
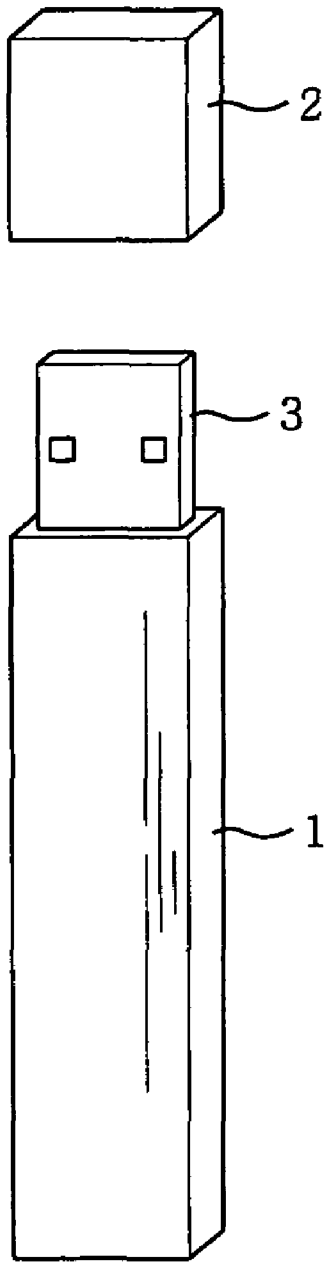
FIG. 1 (PRIOR ART)
FIG. 1 shows a perspective view of a conventional portable storage device having an USB port at one side thereof.
Figure 2:
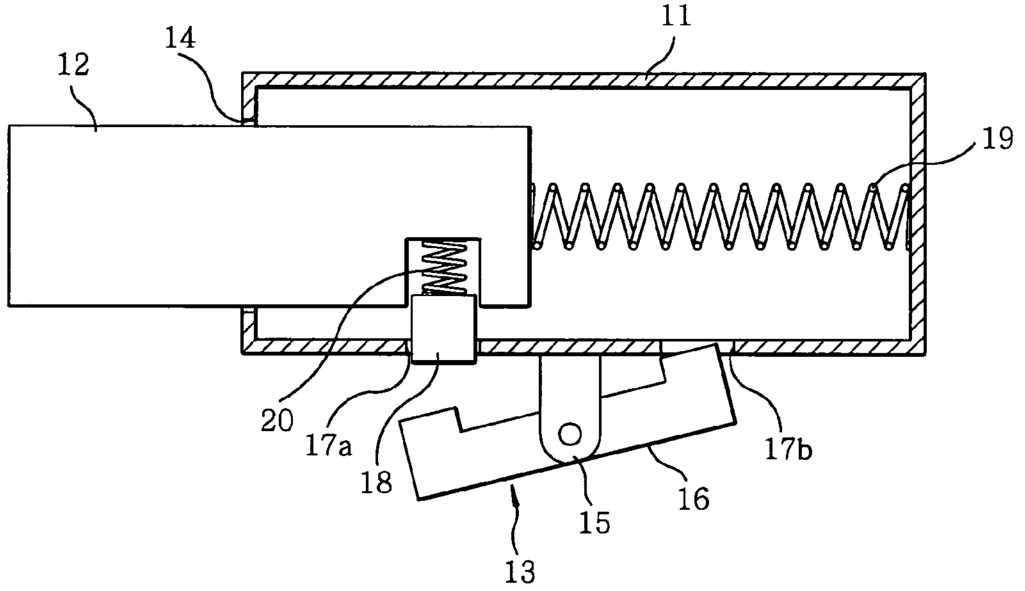
FIG. 2 describes a cross-sectional view of a portable USB storage device in accordance with the present invention.

FIG. 2 describes a cross-sectional view of a portable USB storage device in accordance with the present invention.

As can be seen from FIG. 2, the portable USB storage device in accordance with the present invention does not have a separate sheath for protecting a USB port 12 and is able to selectively keep the USB port 12 inside or outside of a case 11 by using a control switch 16.

The portable USB storage device in accordance with the present invention may be connected to an input/output port of various terminal equipments including a computer so that data can be inputted or outputted. Further, the case 11 contains therein a data storage device and the USB port 12 is installed at one side of the case 11 so as to be kept inside of the case 11 by a sliding travel. A control device 13 for selectively controlling a location of the USB port 12 is provided at one end of the case 11.

Thus, the USB port 12 can be protruded from the case 11 in order to be connected to an input/output port of various terminal equipments (hereinafter, referred to as "using mode"), while the USB port 12 can be kept inside of the case 11 when moved or carried (hereinafter, referred to as "carrying mode").

Formed at one end of the case 11, where the USB port 12 is installed, is a guideway 14 which leads the USB port 12 to travel along in a sliding motion. A stopper 18 is provided at one side of the USB port 12 and operated under the control of the control device 13.

The control device 13 in accordance with the present invention has a control switch 16 and a lever 15 positioned at one end of the case 11. The control switch 16 turns around on the lever 15 as a central axis in a seesaw motion. The case 11 has holes 17*a* and 17*b* at positions corresponding to both end portions of the control switch 16, so that the stopper 18 can be inserted therein. An elastic member 19 is disposed between the case 11 and the USB port 12 to thereby restore the USB port 12.

The USB port 12 in accordance with the present invention slides along a distance between the two holes 17*a* and 17*b*, and the distance therebetween is designed so that the protruded USB port 12 can be sufficiently kept inside of the case 11.

The location of the USB port 12 in accordance with the present invention is fixed by way of the stopper 18 being protruded into the holes 17*a* and 17*b* formed at one end of the case 11. Specifically, when the USB port 12 is protruded, i.e., during the using mode, the stopper 18 is inserted into the front hole 17*a*. On the other hand, in case the USB port 12 is kept inside of the case 11, i.e., during the carrying mode, the stopper 18 is inserted into the rear hole 17*b*. To do so, the structure of the stopper 18 needs to be elastic in the direction perpendicular to a moving direction of the USB port 12. Referring to FIG. 2, there is illustrated the stopper 18 elastically supported by a spring 20. However, since the stopper 18 shown in FIG. 2 is only an example, those who skilled in the art may vary the structure of the stopper 18.

The control switch 16 in accordance with the present invention presses the stopper 18 inserted into the hole 17*a* or 17*b*, so that the USB port 12 can be unlocked and the mode of the USB port 12 may be changed into the using mode or the carrying mode. It is preferable that both end portions of the control switch 16 are bent and protruded toward the stopper 18 to thereby facilitate a deeper press than a depth of the holes 17*a* and 17*b*.

Figure 3:
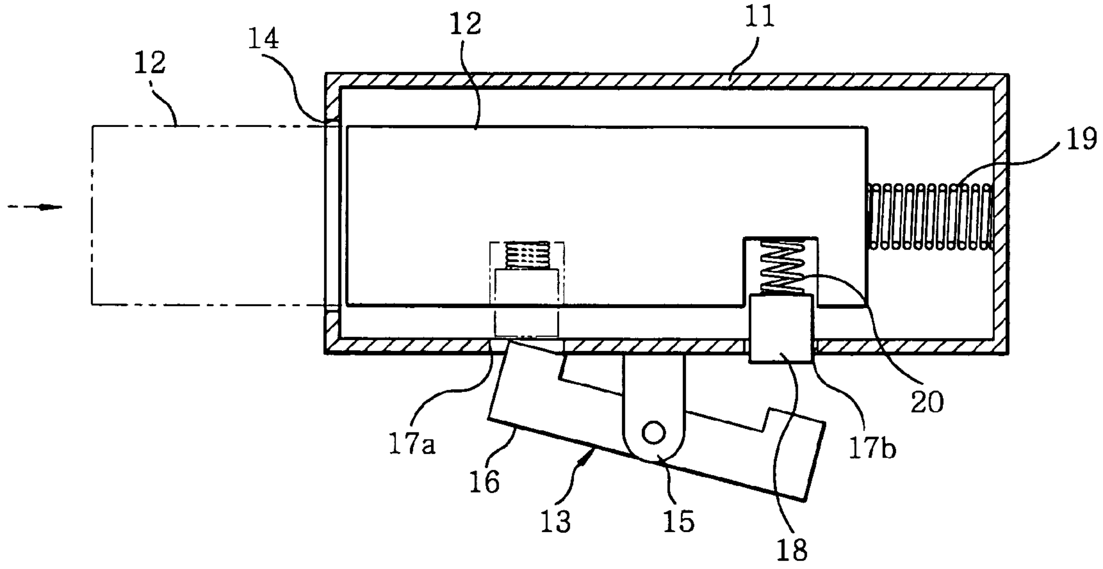
FIG. 3 depicts the state of the portable USB storage device in accordance with the present invention when used or not used.

FIG. 3 presents the state of the portable USB storage device in accordance with the present invention when used or not used.

As illustrated in FIG. 3, in order to connect the portable USB storage device to an input/output port of various terminal devices, the USB port 12 should be protruded from the case 11 and the mode of the USB port 12 should be maintained in the using mode (illustrated as a two dot chain line). However, the USB port 12 can be kept inside of the case 11 and the mode of the USB port 12 may be changed into the carrying mode (illustrated as a solid line) in order to move and carry the portable USB storage device after use.

A process for converting the mode of the USB port 12 into the carrying mode is described as follows. If the control switch 16 is pressed, one end portion thereof presses the stopper inserted into the hole 17*a*, thereby separating the stopper 18 from the hole 17*a* and unlocking the USB port 12. Next, the USB port 12 is pushed by a user and inserted into the case 11 in a sliding motion through the guideway 14. At this time, the stopper 18 is also transferred until it reaches the hole 17*b* and is inserted thereinto by a restoring force of the spring 20 attached to the stopper 18. As a result, the sliding travel of the USB port 12 is stopped, and the mode of the USB port 12 is converted into the carrying mode by the locking of the stopper 18.

As described above, in case the mode of the portable USB storage device in accordance with the present invention is changed into the carrying mode, mobility and portability thereof are enhanced. Further, there is no need for a sheath for protecting the USB port 12. Moreover, it is possible to previously prevent the USB port. 12 from being physically damaged.

In accordance with the present invention, the USB port functioning as a main input/output unit of memories of the portable USB storage device can be kept inside of the case for protection when moved and carried, thereby enhancing usability and convenience of the portable USB storage device.

While the invention has been shown and described with respect to the preferred embodiments, it will be understood by those skilled in the art that various changes and modifications may be made without departing from the spirit and scope of the invention as defined in the following claims.

What is claimed is:

1. A portable USB storage device comprising:

a case containing therein a data storage;

a USB port capable of being inserted into the case in a sliding motion; and a control device for selectively controlling a location of the USB port, wherein the control device has a control switch turning around on a lever as a central axis in a seesaw motion, the lever being positioned at one end of the case; and wherein the case has two holes formed at positions corresponding to both end portions of the control switch, the two holes allowing a stopper to be inserted thereinto; and wherein the case and the USB port have therebetween an elastic member for restoring the USB port.

2. The portable USB storage device of claim 1, wherein the mode of the USB port is converted into a using mode or a carrying mode by control of the control device.

3. The portable USB storage device of claim 1, wherein the case has a guideway at one end thereof so that the USB port can be transferred in a sliding motion.

4. The portable USB storage device of claim 1 wherein the structure of the stopper is elastic in the direction perpendicular to a moving direction of the USB port.

5. The portable USB storage device of claim 1 wherein the stopper is supported by a spring.

6. The portable USB storage device of claim 1 wherein both end portions of the control switch are bent in order to depress the stopper.

* * * * *